United States Patent
Young et al.

(10) Patent No.: US 6,396,298 B1
(45) Date of Patent: May 28, 2002

(54) ACTIVE FEEDBACK PULSED MEASUREMENT METHOD

(75) Inventors: Albert M. Young, Whittier; Samuel S. Osofsky, Torrance, both of CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 09/549,503

(22) Filed: Apr. 14, 2000

(51) Int. Cl.[7] .............................................. G01R 31/26
(52) U.S. Cl. ..................... 324/769; 324/158.1
(58) Field of Search .............................. 324/158.1, 754, 324/765, 769; 365/201; 327/156, 157

(56) References Cited

U.S. PATENT DOCUMENTS 4,368,425 A * 1/1983 Adams ..................... 324/158.1
5,166,608 A * 11/1992 Bowles .................... 324/158.1

OTHER PUBLICATIONS

Scott, J., Parker, A., "Trends in Device Characterisation A Pulsed Semiconductor Parameter Analyser System for III–V FETs" Journal of Electrical and Electronics Engineering, Sep. 1994, pp 196–204, vol. 14, No. 3.

Scott, J. et al., "Pulsed–bias/Pulsed–RF Device Measurement System Requirements" Proceedings of the 24th European Microwave Conference, pp. 951–961, 1994.

* cited by examiner

*Primary Examiner*—Michael J. Sherry
*Assistant Examiner*—Jimmy Nguyen
(74) *Attorney, Agent, or Firm*—Derrick Michael Reid

(57) ABSTRACT

A pulse measurement method is applied to test devices such as high power FET transistors for measuring DC device parameters as well as for measuring S parameters during AC testing. The method uses an input gate bias tee for applying an accurately shaped pulsed input, a sensing bias tee for sensing terminal voltages, such as drain voltages for an FET, and a drive bias tee for coupling in a feedback signal provided by an active feedback circuit receiving AC coupled input error signal of the DC terminal voltage and for providing a drive signal as an error signal so as to maintain the applied DC test voltages at stable levels for improved accuracy.

20 Claims, 7 Drawing Sheets

ACTIVE STABILIZATION CIRCUIT $V_{DS} = V_{DD} - I_D (R_b+R_s) - L_D \, dI_D/dt$

MEASUREMENT CONFIGURATION (PRIOR ART)

ACTIVE STABILIZATION CIRCUIT

VGS PULSE SHAPING CIRCUIT

DUT MEASUREMENT SYSTEM

DUT VOLTAGE AND CURRENT WAVEFORM

DUT I/V CURVES

ACTIVE FEEDBACK PULSED MEASUREMENT METHOD

STATEMENT OF GOVERNMENT INTEREST

The invention was made with Government support under contract No. F04701-93-C-0094 by the Department of the Air Force. The Government has certain rights in the invention.

FIELD OF THE INVENTION

The present invention relates to the field of testing electronic devices. More particularly, the present invention relates to active feedback circuits for minimization of voltage transients during pulsed measurements of semiconductor devices.

BACKGROUND OF THE INVENTION

Semiconductor devices are used in personal communication devices, satellite communications, and electronic warfare applications. Accurate active-device models are critical for implementing a single-pass circuit design cycle for communications circuits. In order to achieve the highest operational efficiency, power devices are often the last stage of amplification in a transmitting circuit and are often operated in compression. In this mode, higher-order harmonics and intermodulation products that affect signal purity can be generated. The magnitude of the instantaneous voltage and current waveforms at the device nodes, such as forward gate current, can significantly affect device reliability. In order to develop a device model that takes into account the nonlinear behavior of high-power semiconductor devices, both DC I-V and RF S-parameter performance measurements must be obtained. Various test systems have been used to accomplish pulsed I-V testing of high-power semiconductor devices. In order to decrease production costs, more accurate models are needed in order to reduce the design cycle, build, and test. These more accurate models depend on the measurement method. From the measurement results, the parameters of a chosen model can be extracted, and then used in circuit simulators in order to design, analyze, and optimize circuit performance under different operational and environmental conditions. The DC and RF measurements must be made in a pulsed manner in order to avoid destructive thermal stresses. Both the DC and RF measurements must be made in a pulsed manner in order to minimize self-heating and surface-state trap effects. The pulsed measurement, if conducted in less than one microsecond, minimizes channel heating and many surface-state trap effects that will adversely impact the accuracy of the final model. Measurements that occur at less than one microsecond or even faster, are required to extract accurate models. This type of system can cost several hundred thousand dollars.

Referring to FIG. 1, pulsed DC I-V measurements and S parameter measurements have been performed using conventional test configurations, such as the configuration shown. A device under test (DUT) 10, for example, a field-effect transistor (FET) is connected through an input bias tee 12 and an output bias tee 14 to the RF equipment 15. The bias tees 12 and 14 are connected to each of the gate and drain nodes of the DUT 10. The DUT 10 is biased with a DC bias $V_{GS}$ supply 16 connected through an input bias tee sense resistor 17. The input bias tee 18 includes an input bias tee inductor 18 $L_G$ that is connected to the gate of the DUT and to coupling capacitor 20, an input bias tee bypass capacitor 22, and the input bias tee sense resistor 17. The output bias tee 14 includes an output bias tee inductor $L_D$ 24 that is connected to the drain of the DUT 10 and is also connected to an output bias tee coupling capacitor 26 and an output bias tee bypass capacitor 28, and the output bias tee bias resistor $R_b$ 30. The capacitors 20 and 26 block the dc current and bias voltages from the rf equipment 15, while the inductors 18 and 24 enable a dc bias voltage to be applied to the DUT 10 while presenting a high impedance to the rf signals from the equipment 15. The output bias tee 14 further includes an output bias tee resistor $R_b$ 30 connected to an output sense resistor $R_{so}$ 32 that is in turn connected to a drain power supply $V_{DD}$ 34. The $R_b$ resistor 30 models parasitic resistance of the output bias tee inductor 24. In most pulsed-IV systems, the drain circuit will require a high-performance and costly pulsed power supply or a well-stabilized constant voltage source that is used to apply the desired drain voltage and simultaneously control transients during a measurement. Conventional test systems apply large voltages to the output bias tee 14 that is connected to the drain of the DUT 10 in order to compensate for the inductive and resistive voltage drops.

A pulsed measurement using the prior art measurement configuration of FIG. 1 initially provides quiescent gate and drain voltages that are applied to the DUT 10. The quiescent gate and drain voltages are applied to the DUT 10, and the DUT is biased beyond cutoff and the drain current is zero. Then, the voltage pulse that is positive relative to the cutoff bias is applied to the gate in order to turn on the DUT 10. A pulse can be applied to the gate or drain or both in order to turn on the DUT 10, while the equipment 15 measures small signal performance for determining the S parameters. In order to control transients at the drain of the DUT 10, the $V_{DD}$ drain power supply 34 may be a pulsed bias supply, such as an HP85120A. The $V_{GS}$ and $V_{DD}$ pulsed power supplies are designed to smoothly ramp the drain current up and then to ramp it down gradually. A VGS pulsed bias supply 16 provides a test pulse the gate of the DUT 10. The VGS pulse causes current to flow in the drain of the DUT 10 during a measurement. When the measurement is conducted in less than one microsecond, self-heating and trap effects are minimized. Throughout the duration of this VGS pulse, a measurement of the DC parameters, including the drain voltage $V_D$, gate voltage $V_G$, gate current $I_G$ and drain current $I_D$, as well as the S-parameters can be made. As a consequence of the measurement pulse being applied to the drain and gate of the DUT 10, there is a rapid change in drain current. A change in the current through the $L_D$ inductor 24 causes a large negative voltage transient to be produced on the drain of the DUT 10 at the leading edge of the drain-current pulse. Similarly, a large positive voltage transient can be produced at the trailing edge of the drain-current pulse. The value of the voltage transient is $LdI_D/dt$ where L is the inductance of the bias-tee inductor 24 and $dI_D/dt$ is slope or rate of change of drain current with respect to time. An I-R voltage drop is produced by the $R_b$ resistance 30 in the output bias tee 14 and any other external resistance that is in series with the drain of the DUT 10. The total drain voltage transient $LdI_D/dt$ and the DUT voltage and current transients produced can be quite large. Because of the transients produced in the bias tee 14, the drain voltages and currents are not constant within the measurement interval. The I-R voltage drop in the bias tee and any other external resistance leads to inaccurate I-R test results and inaccurate S parameter measurements. Averaging of test results to minimizes measured errors caused by the transients during pulse testing further complicates the testing process. These and other disadvantages are solved or reduced using the invention.

SUMMARY OF THE INVENTION

An object of the invention is to provide an active feedback circuit that minimizes damaging voltage transients during pulsed voltage and current (I-V) measurements of high-power semiconductor devices.

Another object of the invention is to reduce drain-voltage transients during pulsed voltage and current measurements of transistors.

Yet another object of the invention is to take measurements just after the rising edge of the gate pulse of a transistor under test to reduce self-heating and trap effects.

The present invention uses three bias tees and places an active feedback circuit around the bias tee providing the drain voltage of a device under test (DUT). A pulsed I-V or pulsed S-parameter measurement can be accomplished within one microsecond of the leading edge of the gate pulse with reduced drain-voltage transients. When the I-V measurements are made quickly after the rising edge of the gate pulse, self-heating and trap effects will be minimized. The gate input pulse can have a small duty cycle to reduce heat in the DUT. A model using parameters extracted from such I-V measurements will then better match the measured performance of the device. The improved model fidelity translates to a more accurate prediction of the circuit performance. The present invention provides an active circuit feedback control of voltage transients with synthesis of low driving point impedance using feedback control that employs parallel combination of amplifiers for wide-bandwidth high-current drive.

The active feedback circuit minimizes voltage transients during pulsed-IV measurements for providing accurate modeling of the DUT. Using the feedback circuit, minimal voltage sag is observed with a reduction in the drain-voltage sag. The effect of the series inductance in the sense bias tee and a series resistor in the drain bias path is effectively removed using active feedback. The significant reduction in the magnitude of the voltage transients keeps the overall system voltages within the safe operating limits of the DUT. The drain current is sensed by measuring the voltage drop across a small sense resistor in the feedback path. Because this small sense resistor is in the feedback path, any voltage drop across this resistance is automatically compensated for by the feedback circuit. A differential amplifier extracts the voltage produced across the small sense resistor for drain-current measurement purposes. The use of the active feedback circuit eliminates the need for a complicated and expensive high-performance, high-current pulsed power supply or well-stabilized voltage sources in the drain circuit. Thus, pulsed-IV measurements can be obtained at significantly lower cost with improved accuracy. These and other advantages will become more apparent in the following detailed description of the preferred embodiment.

DETAILED DESCRIPTION OF THE PREFERRED EMBODIMENT

Figure 1:
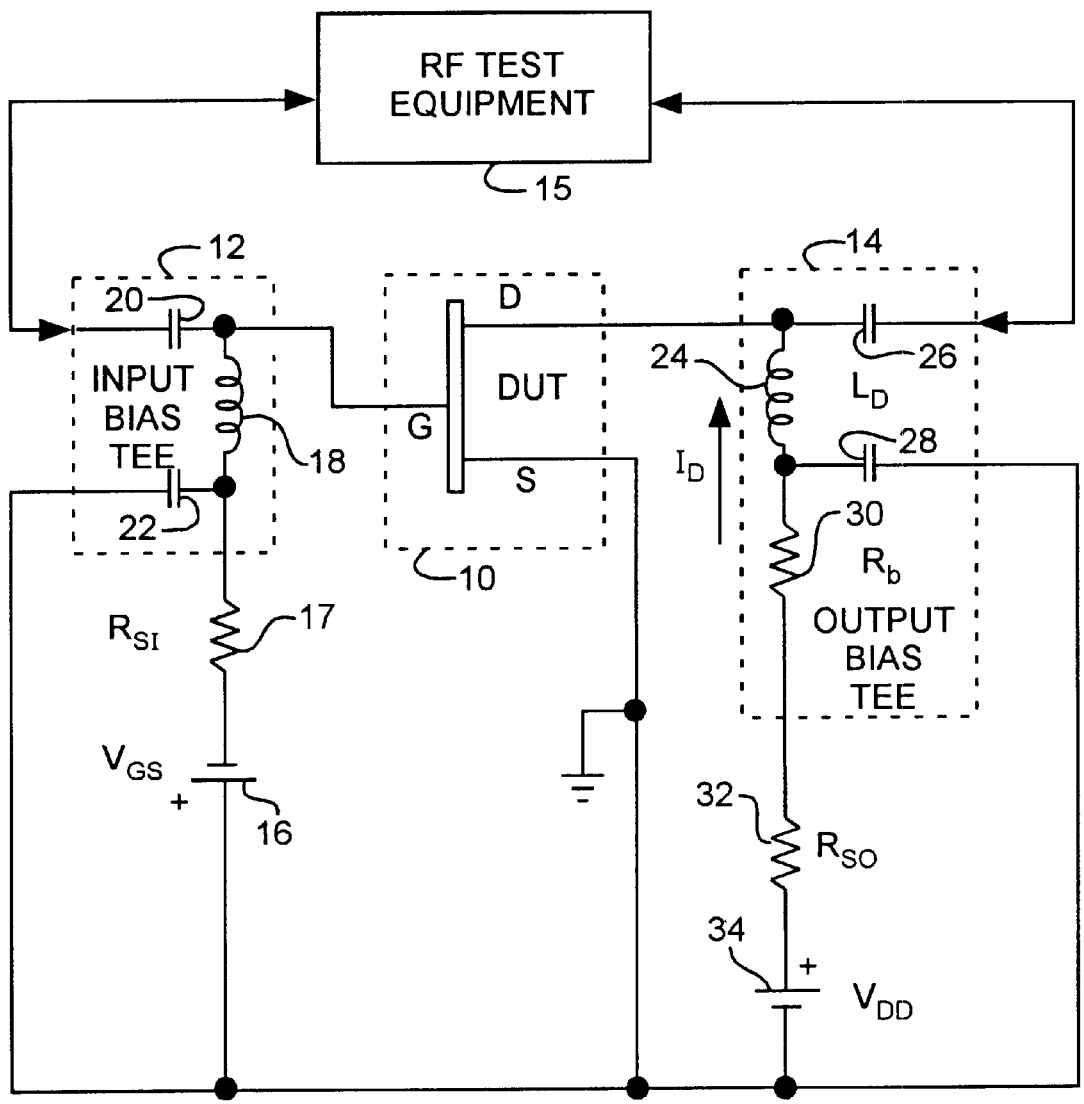
FIG. 1 is a schematic of a prior art measurement test configuration.
Figure 2:
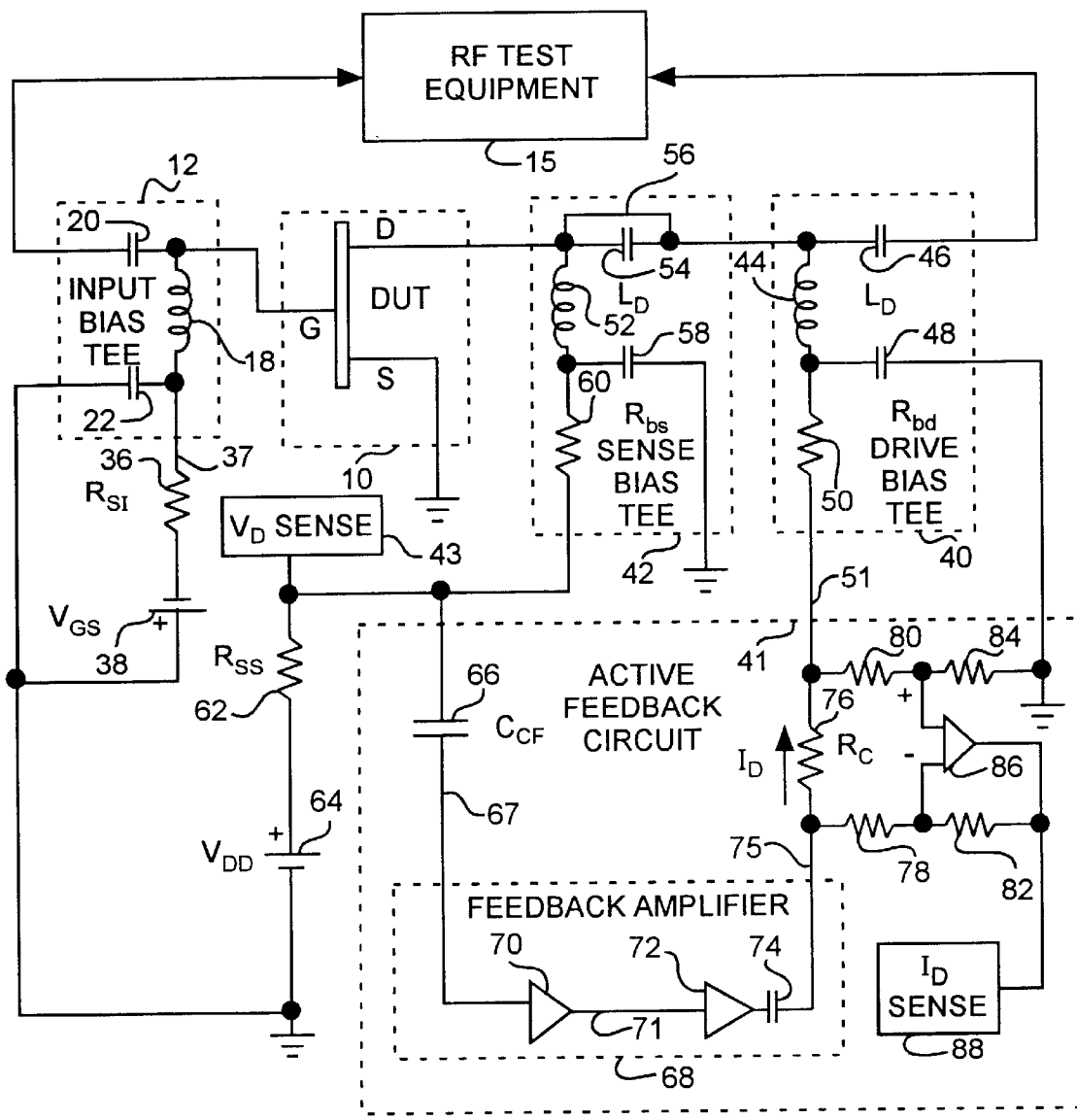
FIG. 2 is a schematic of an active stabilization circuit.

An embodiment of the invention is described with reference to the figures using reference designations as shown in the figures. Referring to FIG. 2, a device under test (DUT) 10 is connected through an input bias tee 12, including inductor 18, and capacitors 20 and 22. The DUT 10 is an exemplar field-effect transistor (FET), but other devices can be tested as well, such as various types of transistors, including BJTs, HBTs, HEMTs, PHEMTs, and MOSFETs. The input bias tee 12 is coupled to an input sense $R_{SI}$ resistor 36 through a sense line 37 providing a sense signal and to an input $V_{GS}$ power supply 38. The input $V_{GS}$ supply 38 pulses the gate of the DUT 10 during pulsed testing. The DUT 10 is further subjected to rf measurements using test equipment 15 during the pulsed testing. The test equipment 15 is further coupled to a drive bias tee 40, an active feedback circuit 41 and a sense bias tee 42. The feedback circuit 41 operates to keep drain to source voltage $V_{DS}$ of the DUT10 equal to $V_{DD}$. The DUT 10 is connected between input bias tee 12 and the sense bias tee 42 for providing a $V_D$ drain voltage sense signal 43. The sense bias tee 42 and drive bias tee 40 may be conventional bias tees. The drive bias tee 40 includes an inductor 44, coupling capacitor 46 coupled to the equipment 15 and a bypass capacitor 48 connected to ground. A bias drive $R_{bd}$ resistor 50 is a parasitic resistance communicating $I_D$ current to the DUT 10 from the active feedback circuit 41. The sense bias tee 42 includes an inductor 52, a coupling capacitor 54 that is short circuited by jumper 56, a bypass capacitor 58 that is connected to ground, and a sense bias tee $R_{bs}$ resistor 60 that models parasitic resistances and provides the $V_D$ sense signal 43, that is in turn connected to a drain sense resistor $R_{SS}$ 62 coupled to a $V_{DD}$ drain supply 64. The drain supply 64 provides DC drain current to the DUT 10 during pulse testing. The coupling capacitor 54 in the sense bias tee 42 has been removed by jumper 56 in order to allow DC current to flow from the feedback circuit 41 through drive bias tee inductor 44 to the drain of the DUT 10.

During pulse testing, the feedback circuit 41 attempts to keep $V_{DS}$ of the DUT 10 equal to $V_{DD}$. The active feedback circuit 41 senses the $V_D$ sense signal 43 from the sense tee 42 and provides the feedback drive signal 51, that is also a feedback error signal in closed loop control, to the drive bias tee 40 forming a feedback loop. The active feedback circuit 41 includes a $C_{CF}$ input coupling feedback capacitor 66 providing an input feedback signal 67 to a feedback amplifier 68 that includes a preamplifier 70 providing a conditioning signal 71 to a power amplifier 72 connected to an output coupling feedback capacitor 74 that provides an output feedback signal 75 to a coupling sense $R_C$ resistor 76 that then provides the feedback drive signal 51. Positive and negative input sense resistors 78 and 80 are connected to sense $R_C$ resistor 76 for sensing the $I_D$ current through the sense $R_C$ resistor 76 and are respectively connected to a input sense resistor 84 and a feedback resistor 82 that are respectively in turn connected to the positive and negative inputs of a sense amplifier 86 that provide an $I_D$ sense signal 88. During testing, the $V_{GS}$ voltage source 38 applies a pulse through the input sense resistor 36 providing the $V_{GS}$ pulse signal to the gate of the DUT 10 while the rf test equipment 15 provides rf measurements of the DUT 10 through tees 12, 42 and 40. During this pulsed testing, the sense bias tee 42 provides the $V_D$ sense signal 43 and while the sense amplifier 86 provides the $I_D$ sense signal 88 under feedback control using the feedback amplifier 68 of the feedback circuit 41. The feedback loop through the inductors 44 and 52, and through the active feedback circuit 41 operates to provide a low impedance at the drain of the DUT 10 to substantially reduce the magnitude of the feedback signal 67 for smooth DC pulsing of the DUT 10. As a result of the low impedance at the drain of the DUT 10, droop of the applied drain voltage is reduced for improved accuracy in measurements during DC pulse testing.

The feedback circuit 41 minimizes the error voltage across the $R_{SS}$ drain sense resistor 62 and equivalently minimizes the current through the $R_{SS}$ drain sense resistor 62. The error voltage in this case is approximately (VDD−VDS), and would be caused by drain current flowing through the $R_{SS}$ drain sense resistor 62, the sense bias tee resistor $R_{bs}$ 60 and the sense bias tee inductor $L_D$ 52. Initially, the gate of the DUT 10 is biased beyond cutoff, when $I_D$ equals zero, and there is no voltage drop across the $R_{SS}$ sense resistor 62, nor the sense bias tee inductor 52. When an appropriate voltage pulse is applied to the gate of the DUT 10, a small drain current starts to flow through the sense bias tee 42, and the voltage at the drain of the DUT 10 starts to sag, that is droop, because of the I-R drop across the $R_{SS}$ drain sense resistor 62, the sense bias tee resistor 60 and the LdI/dt across the sense bias-tee inductor 52. The error voltage produced across $R_{SS}$ drain sense resistor 62 is coupled by capacitor $C_{CF}$ 66 to a feedback amplifier 68. The feedback amplifier has a gain and phase adjustment preamplifier 70 and a feedback power amplifier 72 that is preferably a wideband power amplifier. The preamplifier 70 provides a conditioned feedback signal 71 to the feedback power amplifier 72. The output of the power amplifier 72 is capacitively coupled through an output coupling feedback capacitor 74 for coupling a feedback drive signal 51 to the DUT through the drive bias tee 40. The gain and phase adjustment preamplifier 70 has low pass filter to control the stability of the feedback circuit 41.

The error voltage is any change caused by transients in $V_{DD}$ minus $V_{DS}$ that would be caused by a current through the $R_{SS}$ sense resistor 62. The sense bias tee 42 is connected to the $V_{DD}$ voltage source 64 to set the drain voltage. Because the $V_{DD}$ voltage source 64 does not supply any current to the DUT 10, the voltage source $V_{DD}$ can be an inexpensive low-current power supply. The excitation capacitor 54 in the sense bias tee 42 has been short circuited by line 56 so that pulsed current from the drive bias tee 40 can pass through the sense bias tee 42. The deviation in $V_{DD}$ from $V_{DS}$ is coupled by the $C_{CF}$ capacitor 66 through the preamplifier 70 that functions as a gain and phase adjustment circuit providing the conditioning signal 71 to the feedback power amplifier 72 that is preferably a wideband power amplifier. Excess phase rotation in the feedback loop is partially compensated for by a phase-lead circuit of the preamplifier 70 in the feedback circuit 68.

The error voltage generated across the $R_{SS}$ sense resistor 62, and coupled through the $C_{CF}$ capacitor 66 is adjusted by preamplifier 70 and inverted and amplified by the amplifier 74. The amplifier 74 functions as a pulsed current source that delivers the required feedback drive current $I_D$ 51 during the duration of the gate voltage pulse. The amplifier 74 provides the necessary $I_D$ current through the drive bias tee 40 as a feedback drive signal 51. This feedback drive signal 51 is nominally 180° out-of-phase with the initial signal $V_D$ sense 43. The feedback current generated by the feedback amplifier 68 minus the error current through the $R_{SS}$ drain sense resistor 62 equals the drain current flowing through the DUT 10. The magnitude of the error current approaches zero when the value of the feedback current $I_D$ 51 approaches that of the drain current $I_{LOAD}$ through the DUT 10. The feedback circuit 41 synthesizes a small impedance that is the quotient defined by the error voltage that is equal to the resistance of the $R_{SS}$ drain sense resistor 62 times the error current through the $R_{SS}$ drain sense resistor 62 divided by the load drain current $I_{LOAD}$ of the DUT 10. The gain of the feedback circuit 68 controls the value of the synthesized impedance. As the gain is increased, the values of the synthesized impedance and the error current are decreased. This error current is equal to the current that flows through the low-power dc $V_{DD}$ supply 64 and the $R_{SS}$ sense resistor 62.

The feedback error current through $R_{SS}$ 62 approaches zero when the feedback current 51 equals the load current through the drain of the DUT 10. Thus, a constant voltage $V_{DS}$ is maintained at the drain of the DUT 10 while the required feedback current $I_D$ is supplied by the power amplifier 72 in the feedback circuit 68. The drain current of the DUT 10 is determined by measuring the voltage drop across the small $R_C$ resistor 76 in the feedback loop. Because the $R_C$ resistor 76 is in the feedback loop, any voltage drop over this $R_C$ resistor 76 is automatically compensated for by the feedback circuit 41. The differential amplifier 86 samples the voltage signal produced across $R_C$ resistor 76 for providing the $I_D$ sense signal for measurement purposes.

Figure 3:
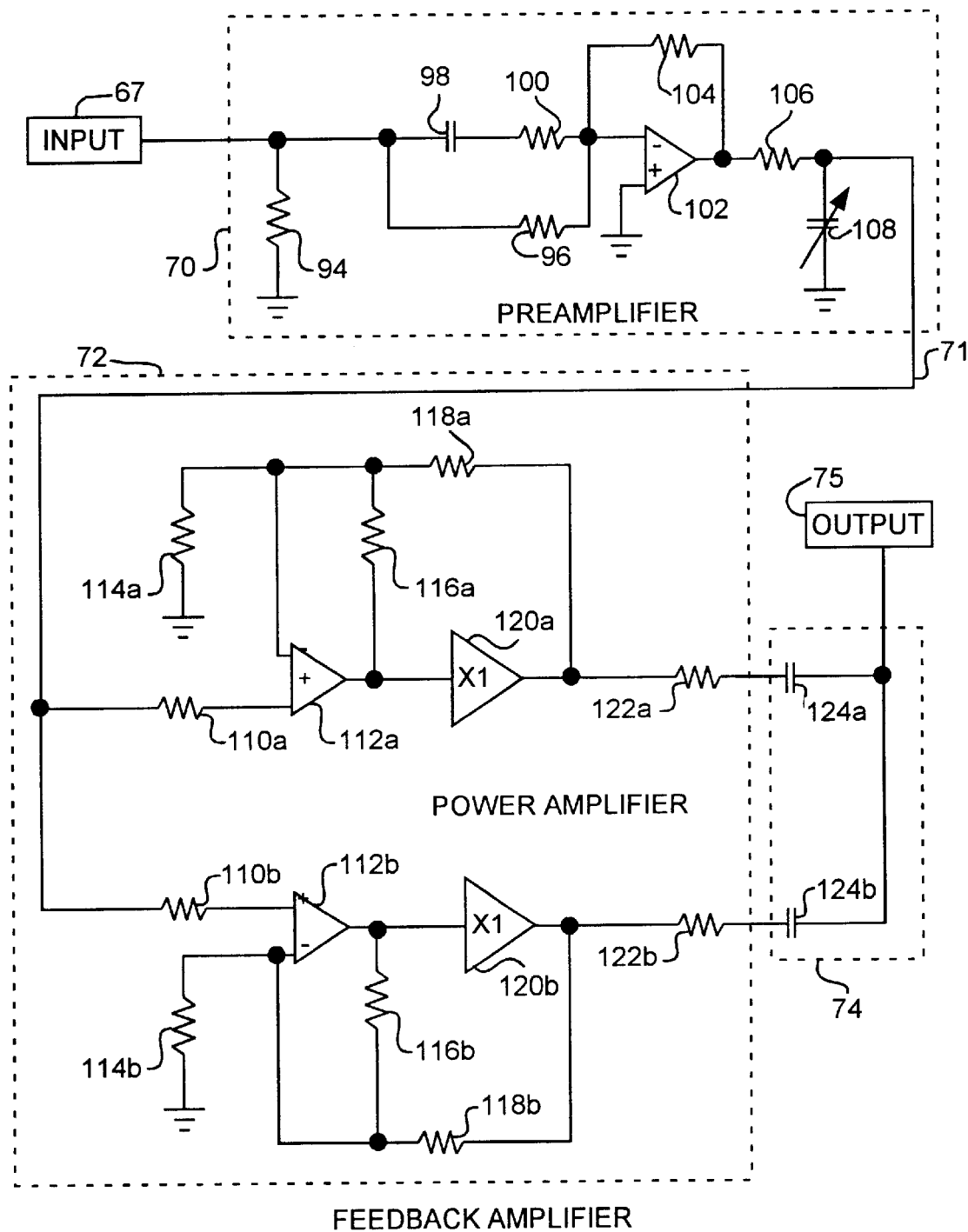
FIG. 3 is a schematic of a feedback amplifier.

Referring to FIGS. 2 and 3, and more particularly to FIG. 3, the preamplifier 70 includes a termination resistor 94, an input resistor 96, a coupling capacitor 98, a coupling resistor 100, a linear amplifier 102, a feedback resistor 104, an output resistor 106 and a variable capacitor 108. The capacitor 108 is varied to adjust the gain and phase of the input signal 67 into the conditioned signal 71 that is communicated to the power amplifier 72. The power amplifier 72 includes two parallel amplifier circuits respectively including input resistors 110a and 110b and amplifiers 112a and 112b, each of which have input resistors 114a and 114b, and feedback resistor 116a and 116b, that are coupled through coupling resistors 118a and 118b to amplifiers 120a and 120b having output resistors 122a and 122b for providing respective output signals connected to capacitor 74. The capacitor 74 is likewise split into two capacitors 124a and 124b that remove offset voltages and that are then connected together to provide the output 75.

The parallel connection of amplifiers 112ab and 120ab is preferred. Often, the higher the output power that an amplifier can provide, the smaller is the operating bandwidth. The bandwidth of an amplifier is related to an inherent response time to transient signals and to delays in transmitting signals through the device. The off-the-shelf high-current amplifier that may be typically used will have a limited bandwidth of operation and a peak current output drive capability. However, the pulsed I-V test system may need to produce very high current levels, such as more than two amps, over a wide bandwidth, for example, ninety megahertz. Amplifiers that have a higher current capability may have smaller bandwidths, thus longer delays that would adversely affect loop stability of the feedback loop with poor transient performance. The parallel combination of these amplifiers 112ab and 120ab retains the inherent bandwidth that is necessary to operate the feedback loop, and yet provide double the available current of each of the amplifier 112ab. The parallel connection of the amplifiers is useful for the following reason. In an exemplar configuration, a commercial buffer amplifier may have, for example, a 90.0 MHz bandwidth, a 3000 mV/s slew rate, and a 1.8 A peak current capability. However, the pulsed-IV system will need to produce more than 1.8 A. Other amplifiers that we examined had higher current capabilities but lower slew rates and smaller bandwidths. A parallel combination of the 2009CT amplifiers retains the slew rate and the bandwidth that is necessary to operate the feedback loop, and yet provide twice the output current of a single amplifier. The number of amplifiers could be at least doubled without degrading performance of the feedback circuit 41. The number of amplifiers could be further increased to provide an even greater peak current without degrading the performance of the feedback circuit.

The active feedback circuit 41 minimizes voltage transients during pulsed I-V measurements of the DUT 10. The feedback circuit 41 detects the sag in drain voltage that is caused by voltage drops produced across both the inductor 52 in the drain bias tee and any series resistance in the dc-current drain path through resistor $R_{bs}$ 60. The feedback signal 51 consists of the current injected into the drain circuit that is sufficient to minimize the change in drain voltage. The feedback circuit 41 actively synthesizes a small driving-point impedance that is seen by the drain of the DUT 10 and is on the order of 0.01 ohms. Larger voltages do not need to be applied to the drain of the DUT 10 in order to overcome the nominal inductive and resistive voltage drops. Therefore, the low current $V_{DD}$ power supply 64 can be used to set $V_{DS}$ for low or high power FETs. Pulsed I-V measurements using the feedback circuit 41 can be rapid, requiring less than one microsecond to acquire the data. The transient test method makes use of the active feedback circuit 41 to stabilize the voltage on the drain of the DUT during the measurement interval with the use of an inexpensive low-current power supply 64 that is used to set the drain voltage.

Figure 4:
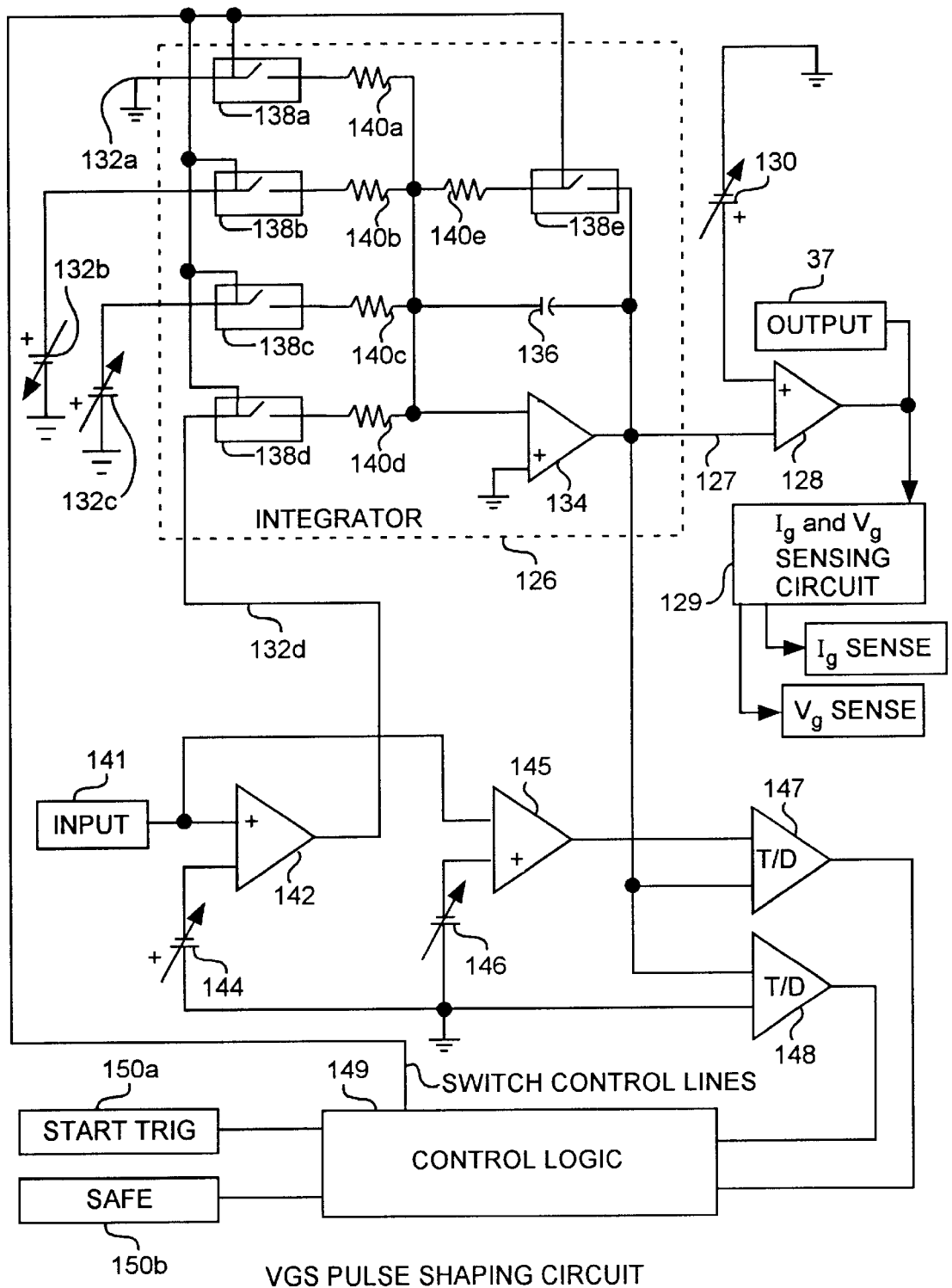
FIG. 4 is a block diagram of a VGS pulse shaping circuit.

Referring to FIGS. 1 through 5, and more particularly to FIG. 4, a gate-pulse conditioning circuit generates and determines the overall pulse shape of the gate bias pulse, including the ground level, pulse level, risetime, falltime, and pulsewidth. The slope of the rising and falling edges can be set independently of each other. Thus, the turn-on time can be relatively fast in order to meet the one microsecond measurement time limit, while the turn-off time can be slower in order to minimize the turn-off transients. The use of this gate-pulse shaping circuit reduces but does not eliminate the voltage transients produced by the drain bias-tee inductors. The shaping circuit has no effect on drain voltage sag produced across resistances in the bias path.

The $V_{GS}$ pulse shaping circuit includes an integrator 126 providing an inverted output 127 for driving an inverting output buffer 128 having a variable voltage source 130 that controls the offset from a ground level of the output pulse 37. The integrator 126 is further connected to a ground line 132a, variable voltage sources 132b and 132c, and a pulse level signal 132d for driving an integration amplifier 134 having a feedback capacitor 136. The ground line 132a, variable voltages 132b and 132c, and the pulse signal 132d are respectively connected to switches 138a, 138b, 138c and 138d, that are in turn respectively connected to resistors 140a, 140b, 140c and 140d, all of which are connected to a feedback switch 138e through feedback resistor 140e that are in turn connected in a feedback path to the amplifier 134 and feedback capacitor 136. In practice, voltages from sources 132b and 32c are set at desired DC levels. The voltage source 132b controls the ramp up and therefore the risetime and source 132c controls the ramp down and therefore the fall time of the output pulse 37. The ground line 132a and the voltage level of the analog signal input 132d respectively control the ground and pulse level of the output 37. An input 141 is an analog signal that drives an input buffer amplifier 142 that in turn provides the pulse signal 132d using a variable voltage source 144. The input signal 141 also drives a threshold buffer amplifier 145 using a variable voltage source 146 for providing a threshold signal to threshold detectors 147 and 148 that compare the threshold signal to the integrator output 127 of integrator 126 for providing respective leading and trailing edge detection signals to control logic 149. The detector 147 provides an upper limit detection signal and detector 148 provides a lower limit detection signal. The voltage signal 141 plus the voltage source 146 establish a threshold level for the detector 147. The upper limit detection signal is for controlling the end of the ramp up of the signal 127. The control logic 149 receiving the leading and trailing edge timing signals from the detectors 147 and 148 as well as a start trigger signal 150a and a safe signal 150b for generating switch control signals on switch control lines that control the switches 138abcde. The safe signal 150b is an enabling signal and the start trigger signal 150a initiate the creation of the output pulse 37.

In operation, a start trigger signal 150a is received after a safe signal 150b. The reception of the start trigger signal 150a causes switch 138a and 138e to open and switch 138b to close. Then, capacitor 136 begins to charge causing the voltage 127 to increase from zero. The rate of charge is controlled by the current through resistor 140b and is a function of the value of the voltage from voltage source 132b. When the voltage 127 reaches the threshold established by the input analog voltage 141 and offset voltage 146, switch 138b is opened, thus halting the ramp up of voltage 127. Switches 138e and 138d then close, causing the voltage 127 to be held at a level value proportional to the value of voltage 141 and offset voltage 144. After a predetermined time established by the control logic 149, switches 138d and 138e open and switch 138c closes. When switch 138c closes, the voltage 127 ramps down. When the voltage 127 approaches the ground level, threshold detector 148 signals the control logic 149 to open switch 138c and to close switches 138a and 138e that then keep voltage 127 at zero until the reception of the next start trigger signal 150a. In this manner, the VGS pulse shaping circuit creates the desired output pulse 37 by controlling the risetime, falltime, pulse width, pulse level and ground level. The pulse shaping circuit further includes an $I_g$ and $V_g$ sensing circuit 129 for proving $I_g$ and $V_g$ sense signals.

Figure 5:
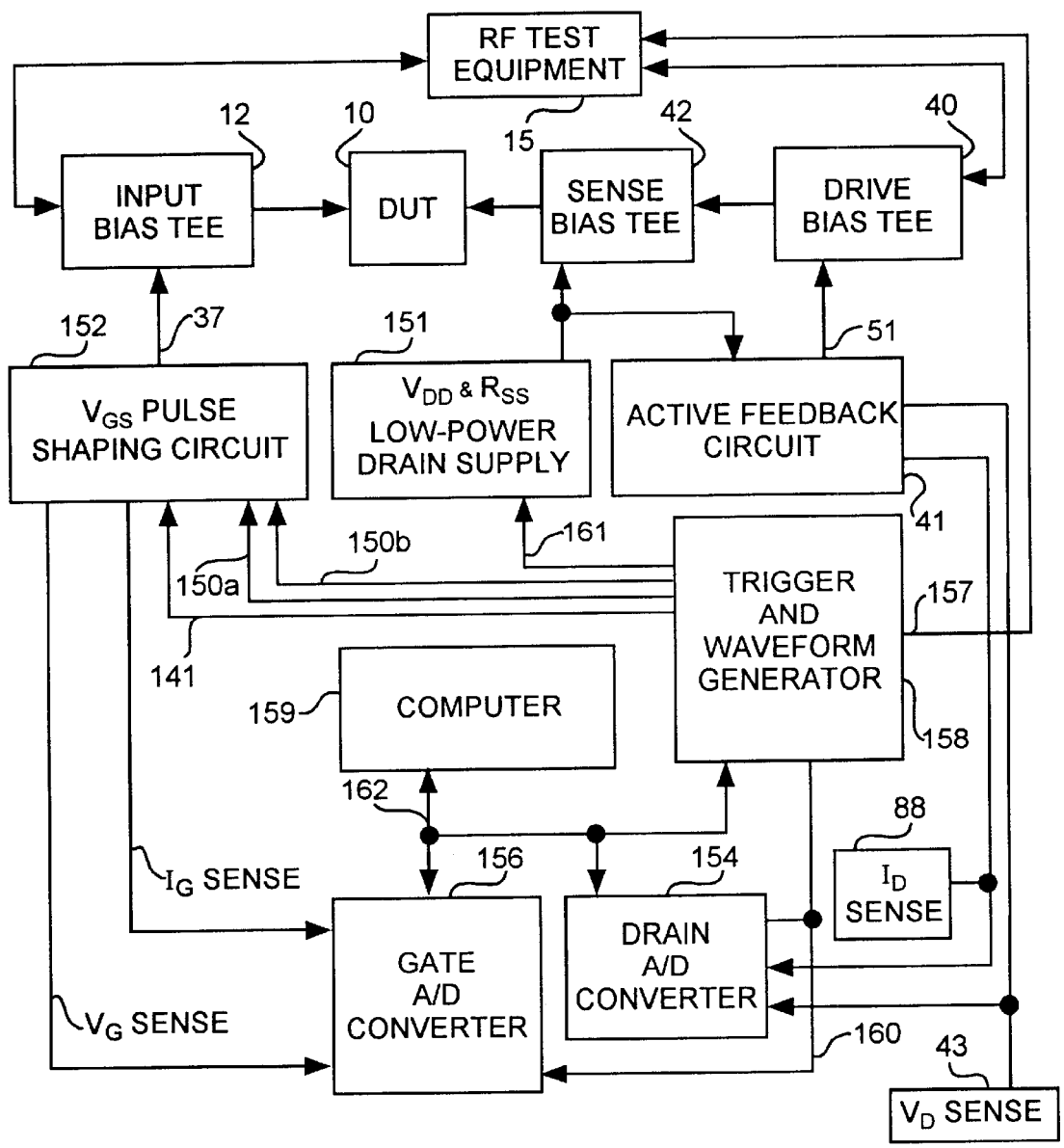
FIG. 5 is a block diagram of a DUT measurement system.
Figure 6:
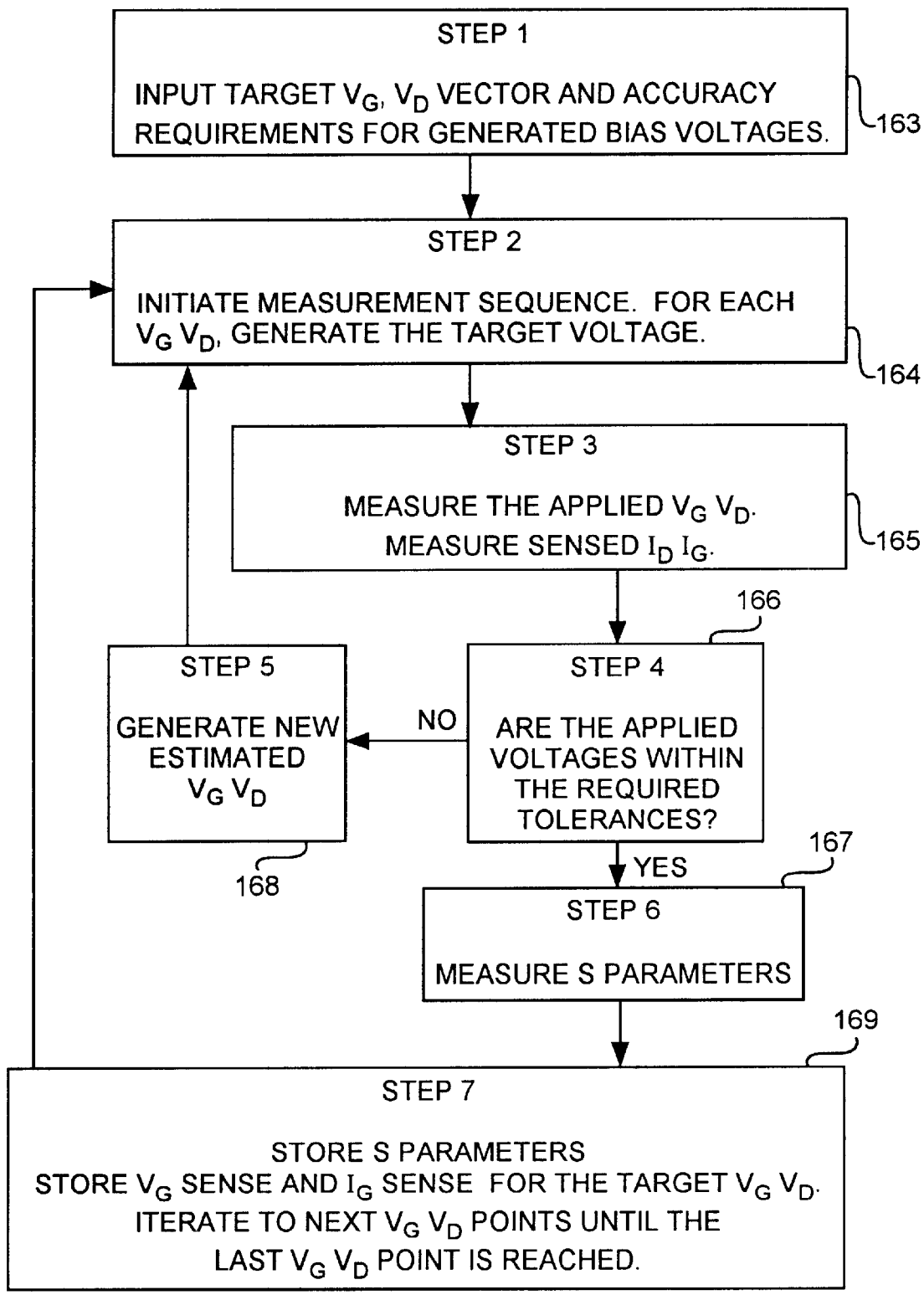
FIG. 6 is a flow diagram of a DUT measurement procedure.

Referring to FIGS. 1 through 6, and more particularly to FIGS. 5 and 6, the pulse testing method can be implemented in a DUT measurement system. The system includes the RF test equipment for measuring S parameters during pulse testing of the DUT 10 coupled to the bias tees 12, 40 and 42 and the feedback circuit 41 providing the $V_{GS}$ pulse 37 from the $V_{GS}$ shaping circuit 152 to the input tee 12, and the $V_D$ sense signal 43 from the active feedback circuit 41 of the pulsed-IV measurement system. During S parameter measurements, the inductors 18, 52 and 44 block S parameter high frequency test signals from coupling into and being effected by bias circuits including the $V_{GS}$ pulse shaping circuit 38, the DC supply $V_{DD}$ 64, and the active feedback circuit 41, so as to maintain pulse and bias DC levels. The inductors 18, 52 and 44 effectively block AC signals from the feedback signal 67 and consequently also from the feedback drive signal 51.

The shaping circuit 152 generates the $V_{GS}$ voltage signal 37 that is applied to the gate of the DUT through the tee 12. The $V_{GS}$ shaping circuit replaces the $R_{SI}$ resistor 36 and $V_{GS}$ voltage source 38 in the preferred form to produce predetermined pulse waveforms to the DUT 10 during testing. During testing, the $I_D$ sense signal 88 and the $V_D$ sense signal 43 is communicated to a drain analog to digital (A/D)

converter 154. The test equipment 15 is triggered during testing by a test equipment trigger signal 157 provided by a trigger and waveform generator 158 that is in turn controlled by a computer 159. The trigger and waveform generator 158 also provide a converter trigger signal 160 to the drain A/D converter 154 and a gate analog to digital (A/D) converter 156 that receives the $I_g$ sense and $V_g$ sense signals from the shaping circuit 152. The converters 154 and 156 provide digital values of the $I_D$ sense signal and $V_D$ sense signals, and the $I_g$ sense and $V_g$ sense signals, respectively, to the computer 159 through a computer bus 162 that is connected to the converters 154 and 156, and generator 158. The generator 158 also provides converter trigger signal 160 for sensing the $I_D$ sense signal and the $V_D$ sense signal and provides a $V_{DD}$ control signal for controlling the level of the $V_{DD}$ supply 64.

The DUT measurement system uses data-acquisition and control software. Improvements in the software and hardware interface will allow for measurements even more quickly after the beginning of the gate pulse. The DUT measurement procedure provides an input 163 that is a target gate and drain voltage vector used to adjust the supply voltages 38 and 64 to realize the required target voltage vector within accuracy requirements. The test is initiated 164 to start generating the target $V_g$ and $V_D$ test voltages that are then measured 165. The applied voltages $V_D$ and $V_G$ are sensed as $V_D$ sense and $V_G$ sense respectively by converters 154 and 156. The $V_D$ sense and $V_G$ sense signals are then compared 166 to the accuracy of the target voltage 163 to determined if the sensed $V_D$ and $V_G$ sense voltages are within tolerances to the target voltage $V_D$ and $V_G$ voltages. If the $V_D$ and $V_G$ sense voltages are not within the tolerances, then the applied voltages are adjusted to then generate new applied $V_g$ and $V_D$ voltages 164 that will in turn cause an adjustment to the $V_g$ sense and $V_D$ sense voltages as well as the measured $I_D$ and $I_G$ sensed current signals. The applied $V_G$ and $V_D$ voltage are adjusted in the loop 164, 165, 166 and 168 until the $V_G$ and $V_D$ sense voltages are within the required accuracy 166, at which time the S parameters can be measured 167. The S parameters, the applied $V_G$ and $V_D$ voltages, $V_g$ and $V_D$ sense voltages, and the $I_D$ and $I_G$ sense current values are stored 169, to then complete a test run of the DUT. The test can be run a several times through the loop 164–169 to generate a family of performance curves at respected applied $V_G$ and $V_D$ as defined by the input vector 163.

Figure 7:
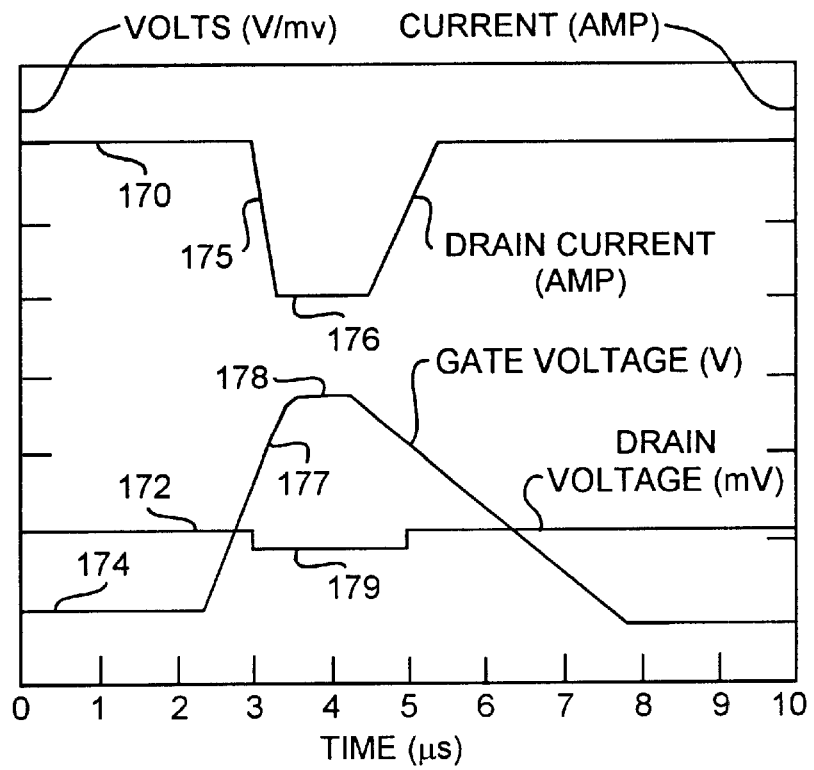
FIG. 7 is a graph of I-V DUT measurements.
Figure 8:
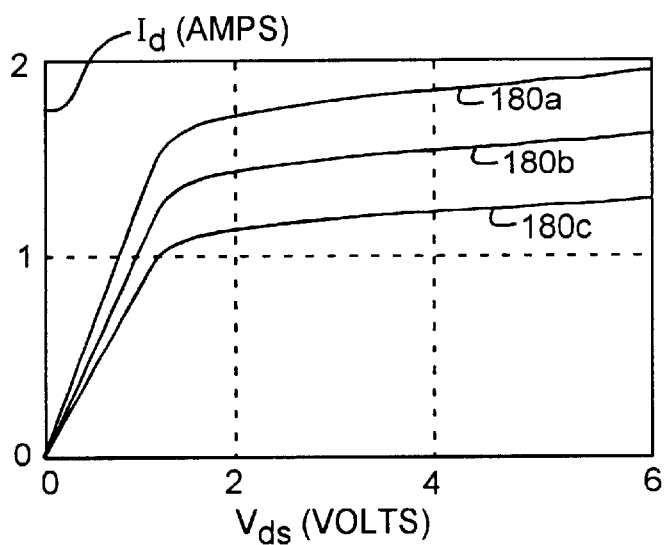
FIG. 8 is a graph of DUT I-V curves.

Referring to all of the Figures, and more particularly to FIGS. 7 and 8, the pulsed I-V test method can be used to measure the response of a high-frequency high-power FET, for example an FL7177 FET 10. For exemplary values, the bias-tee inductances 18, 62 and 44 are approximately 30.0 nH, while the series resistance of the bias tee and $R_{SI}$, is 2.7 ohms. For initial bias conditions, $V_{DD}$ equals 4.0V and $V_{GS}$ equals −7.0V, while the target measurement bias conditions of $V_{DS}$ equals 4.0V and $V_{GS}$ equals zero volts. The drain current $I_D$ flowing through the DUT 10, as indicated by $I_D$ sense 88 is 1.8A 176 and the drain current risetime 175 is approximately 200 ns. Increasing the drain current causes a decreasing $I_D$ drain sense signal. As the drain current of the DUT 10 increases, the voltage on the drain $V_D$ decreases resulting in an error signal 67. The error current supplied by the DC drain voltage supply is about 0.04V/2.7 ohms or 15 mA, while the drain current 170 supplied by the feedback amplifier is 1.8A. The effective synthesized impedance, when calculated, becomes 0.04V/1.8A or 0.022 ohms. The drain voltage 172 is stable 400 ns after the drain current 170 has reached its maximum value 176. Pulsed-IV measurements were obtained by sampling the drain voltage and current waveforms 700 ns after the start of the drain current pulse 175. In FIG. 8, a family of curves are shown for an exemplar DUT at various applied drain voltages. The generated positive slope in the ID curves 180a, 180b and 180c, for drain voltages greater than 2V implies that self-heating effects are minimal. Each pulse measurement may be characterized by three waveforms, including the drain current 170, drain voltage 172 and gate voltage 177. The drain current voltage waveform 170 is the output of the differential amplifier that normally senses the drain current flowing in the feedback circuit.

As may now be apparent, the DUT test configuration uses two bias tees 40 and 42 for respectively sensing and driving the drain terminal of the DUT 10. The bias tees 12, 42 and 40 may be off the shelf conventional type bias tees with coupling capacitors 20, 54 and 46. In the preferred form a the conventional sensing bias tee 42 is used. However, the capacitor 56 in sensing bias tee 42 is short circuited so as to allow the drain drive current $I_D$ to flow into the drain of the DUT 10. The active feedback circuit 41 coupled through the drive bias tee 40 provides drain current $I_D$ through the sense bias tee 42 to rapidly stabilize the applied $V_D$ voltage to the DUT for improved measurement accuracy. The present invention enables the testing of high power transistors using an active feedback circuit to control the applied voltages for improved testing. Those skilled in the art can make enhancements, improvements and modifications to the invention, and these enhancements, improvements and modifications may nonetheless fall within the spirit and scope of the following claims.

What is claimed is:

1. A method of testing a device under test (DUT) having an input terminal and an output terminal, the method comprising the steps of, DC applying a DC voltage level through AC sensing isolation to the output terminal, pulsed applying a pulsed input signal through AC input isolation to the input terminal, the pulsed input signal serving to activate the DUT to conduct output current through the output terminal at an output voltage level, DC sensing the output voltage level through the AC sensing isolation to provide a DC sensing signal AC sensing the DC sensing signal through AC feedback coupling to provide an AC feedback signal, and feeding back the AC feedback signal as a feedback drive signal through AC correction coupling and through AC drive isolation to provide the output current with a feedback drive signal for correcting the output current to stabilized the output voltage at a DC voltage level during the pulsed input signal.

2. The method of claim 1 wherein, the AC sensing isolation is provided by sensing inductive isolation, the AC input isolation is provided by input inductive isolation, the AC drive isolation is provided by drive inductive isolation, the AC feedback coupling is provided by capacitive feedback coupling, and the AC correction coupling is provided by capacitive correction coupling.

3. The method of claim 1 wherein, the AC sensing isolation is provided by filtering isolation, the AC input isolation is provided by filtering isolation, the AC drive isolation is provided by filtering isolation, the AC feedback coupling is provided by capacitive feedback coupling, and the AC correction coupling is provided by capacitive correction coupling.

4. The method of claim 1 further comprising the steps of, level pulse shaping the pulsed input signal at a predetermined low level when not pulsed and at a predetermined high level when pulsed, risetime pulse shaping to provide a predetermined rise time between the predetermined low level and high level, at the beginning of the pulsed input signal, and falltime pulse shaping to provide a predetermined falltime between the predetermined high level and low level at the end of the pulsed input signal.

5. The method of claim 1 further comprising the step of,

S parameter coupling input S parameters signals through AC input capacitive coupling to the input terminal and through AC output capacitive coupling to the output terminal during the input pulsed signal, and S parameter measuring output S parameters signals through the AC input capacitive coupling to the input terminal and through the AC output capacitive coupling to the output terminal during the input pulsed signal, the sense, input, and drive isolation serving to block the input and output S parameters signals from coupling into the feedback input signal and the feedback drive signal.

6. The method of claim 5 wherein the feedback step serves to provide a low impedance at the output terminal for the output voltage and for the output current and serves to provide high impedance at the output terminal for the input S parameter signal and the output S parameter signal.

7. The method of claim 1 wherein, the DUT is a field effect transistor (FET), the output terminal is a drain terminal of the FET, and the input terminal is a gate terminal of the FET.

8. The method of claim 1 wherein, the DUT is a field effect transistor (FET), the output terminal is a drain terminal of the FET, and the input terminal is a gate terminal of the FET.

the AC input isolation is provided by an input bias tee inductor connected to the gate terminal of the FET, the AC sense isolation is provided by a sense bias tee inductor connected to the drain terminal of the FET, and the AC drive isolation is provided by a drive bias tee inductor connected to the drain terminal of the FET for coupling the AC feedback drive signal to the FET.

9. The method of claim 1 wherein the feedback step serves to provide low impedance at the output terminal.

10. The method of claim 1 wherein the feedback step serves to provide low impedance at the output terminal for the output voltage and for the output current and serves to provide high impedance at the output terminal for the input S parameter signal and the output S parameter signal.

11. The method of claim 1 further comprising the step of, repeating the pulsed applying step a plurality of times for a respective plurality of different input levels of the pulsed input signal, repeating the DC applying step a plurality of times for a respective plurality of the output voltage level, and measuring current into the output terminal during the application of the pulsed input signal at plurality of different input levels and at the plurality of output voltage levels.

12. A method of testing a field effect transistor (FET) having a gate terminal and a drain terminal, the method comprising the steps of, DC applying a DC voltage level through a sense bias tee providing AC sensing isolation to the drain terminal, pulsed applying a pulsed input signal through an input bias tee providing AC input isolation to the gate terminal, the pulsed input signal serving to activate the FET to conduct drain current through the drain terminal at a drain voltage level, DC sensing the drain voltage level through the AC sensing isolation to provide a drain sensing signal AC sensing the drain sensing signal through AC feedback coupling to provide an AC feedback signal, and feeding back the AC feedback signal as a feedback drive signal through AC correction coupling and through a drive bias tee providing AC drive isolation to provide the drain current with a feedback drive signal for correcting the drain current to stabilized the drain voltage at a drain voltage level during the pulsed input signal.

13. The method of claim 12 wherein, the AC sensing isolation is provided by sensing inductive isolation in the sensing bias tee, the AC input isolation is provided by input inductive isolation in the input bias tee, the AC drive isolation is provided by drive inductive isolation in the drive bias tee, the AC feedback coupling is provided by capacitive feedback coupling, and the AC correction coupling is provided by capacitive correction coupling.

14. The method of claim 12 wherein, the AC sensing isolation is provided by filtering isolation in the sensing bias tee, the AC input isolation is provided by filtering isolation in the input bias tee, the AC drive isolation is provided by filtering isolation in the drive bias tee, the AC feedback coupling is provided by capacitive feedback coupling, and the AC correction coupling is provided by capacitive correction coupling.

15. The method of claim 12 further comprising the steps of, level pulse shaping the pulsed input signal at a predetermined low level when not pulsed and at a predetermined high level when pulsed, risetime pulse shaping to provide a predetermined risetime between the predetermined low level and high level, at the beginning of the pulsed input signal, and falltime pulse shaping to provide a predetermined falltime between the predetermined high level and low level at the end of the pulsed input signal.

16. The method of claim 12 further comprising the steps of,

S parameter coupling input S parameters signals through AC input capacitive coupling to the gate terminal and through AC output capacitive coupling to the drain terminal during the input pulsed signal, and S parameter measuring output S parameters signals through the AC input capacitive coupling to the gate terminal and through the AC output capacitive coupling to the drain terminal during the input pulsed signal, the sense, input, and drive isolation serving to block the input and output S parameters signals from affecting the feedback input signal and the feedback drive signal.

17. The method of claim 16 wherein the feedback step serves to provide a low impedance at the output terminal for the output voltage and for the output current and serves to provide high impedance at the output terminal for the input S parameter signal and the output S parameter signal.

18. The method of claim 12 further comprising the steps of, level pulse shaping the pulsed input signal at a predetermined low level when not pulsed and at a predetermined high level when pulsed, the time duration of the predetermined high level is less than one microsecond, risetime pulse shaping to provide a predetermined risetime between the predetermined low level and high level, at the beginning of the pulsed input signal, and falltime pulse shaping to provide a predetermined falltime between the predetermined high level and low level at the end of the pulsed input signal.

19. The method of claim 12 further comprising the steps of, level pulse shaping the pulsed input signal at a predetermined low level when not pulsed and at a predetermined high level when pulsed, S parameter coupling input S parameters signals through AC input capacitive coupling to the gate terminal and through AC output capacitive coupling to the drain terminal during the input pulsed signal, and S parameter measuring output S parameters signals through the AC input capacitive coupling to the gate terminal and through the AC output capacitive coupling to the drain terminal during the input pulsed signal, the sense, input, and drive isolation serving to block the input and output S parameters signals from affecting the feedback input signal and the feedback drive signal, and repeating all the steps of the method a plurality of times at a respective plurality of the predetermined high level of the pulsed input signal.

20. The method of claim 19 wherein the feedback step serves to provide a low impedance at the output terminal for the output voltage and for the output current and serves to provide high impedance at the output terminal for the input S parameter signal and the output S parameter signal.

* * * * *